United States Patent
Rountree

(10) Patent No.: US 8,669,806 B2
(45) Date of Patent: Mar. 11, 2014

(54) LOW VOLTAGE ANTIFUSE PROGRAMMING CIRCUIT AND METHOD

(71) Applicant: Robert Newton Rountree, Cotopaxi, CO (US)

(72) Inventor: Robert Newton Rountree, Cotopaxi, CO (US)

( * ) Notice: Subject to any disclaimer, the term of this patent is extended or adjusted under 35 U.S.C. 154(b) by 0 days.

(21) Appl. No.: 13/775,672

(22) Filed: Feb. 25, 2013

(65) Prior Publication Data

US 2013/0229222 A1    Sep. 5, 2013

Related U.S. Application Data

(60) Provisional application No. 61/606,573, filed on Mar. 5, 2012.

(51) Int. Cl.
*H01H 37/76*     (2006.01)
*H01H 85/00*     (2006.01)
*H03K 17/687*    (2006.01)

(52) U.S. Cl.
USPC .......................................... 327/525; 327/428

(58) Field of Classification Search
USPC .................................................. 327/428, 525
See application file for complete search history.

(56) References Cited

U.S. PATENT DOCUMENTS

| | | | | |
|---|---|---|---|---|
| 4,605,872 A * | 8/1986 | Rung | | 327/525 |
| 4,777,517 A * | 10/1988 | Onodera et al. | | 257/274 |
| 5,661,323 A * | 8/1997 | Choi et al. | | 257/378 |
| 5,859,562 A | 1/1999 | McCollum | | |
| 5,909,049 A | 6/1999 | McCollum | | |
| 6,016,264 A * | 1/2000 | Lin | | 365/96 |
| 6,400,632 B1 * | 6/2002 | Tanizaki et al. | | 365/225.7 |
| 6,438,059 B2 * | 8/2002 | Akita et al. | | 365/225.7 |
| 6,444,558 B1 | 9/2002 | Cutter et al. | | |
| 7,002,829 B2 | 2/2006 | Singh et al. | | |
| 7,429,886 B2 * | 9/2008 | Huang et al. | | 327/525 |
| 2006/0176636 A1 * | 8/2006 | Seo | | 361/112 |

* cited by examiner

*Primary Examiner* — Lincoln Donovan
*Assistant Examiner* — Colleen O Toole

(57) ABSTRACT

A circuit for programming a fuse is disclosed. The circuit includes a voltage supply terminal (Vp) and a latch circuit comprising a p-channel transistor and an n-channel transistor (208-214). A semiconductor controlled rectifier (206) in the circuit includes at least one terminal of the p-channel transistor. A fuse (200) is coupled between the voltage supply terminal and the semiconductor controlled rectifier. The fuse is programmed in response to the semiconductor controlled rectifier.

20 Claims, 3 Drawing Sheets

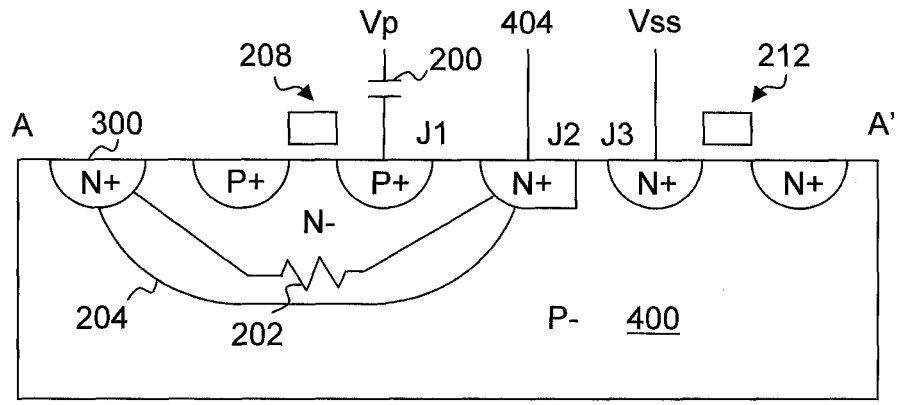
FIG. 4
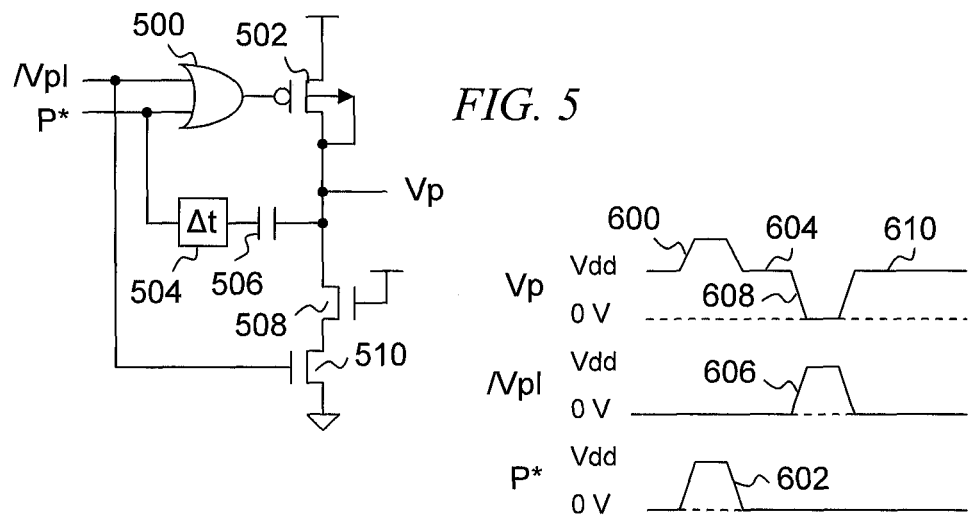
FIG. 5
FIG. 6
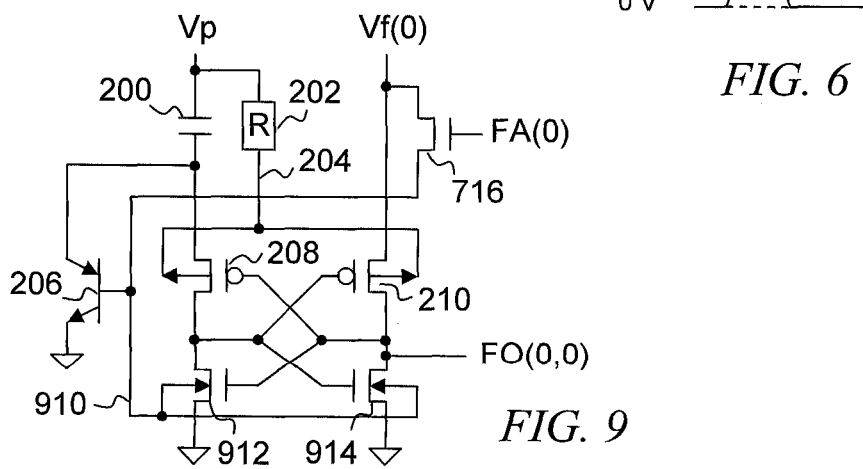
FIG. 9

LOW VOLTAGE ANTIFUSE PROGRAMMING CIRCUIT AND METHOD

This application claims the benefit under 35 U.S.C. §119 (e) of Provisional Appl. No. 61/606,573, filed Mar. 5, 2012, which is incorporated herein by reference in its entirety.

BACKGROUND OF THE INVENTION

Embodiments of the present invention relate to programming an antifuse under low voltage power supply and process limitations for an integrated circuit in either wafer or packaged form.

Referring to FIG. 1A, there is a current-voltage diagram of a semiconductor controlled rectifier (SCR) of the prior art. FIG. 1B is a simplified diagram of the SCR showing the PNPN impurity layers and intervening junctions J1-J3. Here and in the following discussion it should be understood that a semiconductor controlled rectifier may also be called a silicon controlled rectifier or a thyristor as described by S. M. Sze, "Semiconductor Devices Physics and Technology" 148-156 (John Wiley & Sons 1985). In general, a silicon controlled rectifier is a special case of a semiconductor controlled rectifier that is specifically formed on a silicon substrate. The current-voltage diagram shows a reverse blocking region 100 where junctions J1 and J3 are reverse biased, but junction J2 is forward biased. By way of contrast, junctions J1 and J3 are forward biased, but junction J2 is reverse biased in the forward blocking region 102. At switching voltage Vsw 104, the SCR switches from the forward blocking region to a holding voltage (Vh) and holding current (Ih) region 106. In this mode all three junctions J1-J3 are forward biased and the minimum holding voltage across the SCR may be as low as a single diode drop or approximately 0.7 V. In holding region 106, therefore, the SCR functions as a near ideal switch for programming fuses or antifuses.

Antifuses are preferably formed by two conductive terminals separated by an intervening dielectric as disclosed by Cutter et al. in U.S. Pat. No. 6,444,558, and incorporated by reference herein in its entirety. Prior to programming, antifuses typically have a very high resistance on the order of 1e9 ohms. The antifuse is typically programmed by placing a voltage across the intervening dielectric to produce an electric field in excess of 10 MV/cm. This is sufficient to rupture the dielectric, but the antifuse resistance may still remain high and unpredictable. After dielectric rupture, therefore, the antifuse is subjected to a relatively high current of 10-30 mA for a short period of time and often at a lower voltage than required for dielectric rupture. This is often referred to as soaking the antifuse to melt and alloy the conductive material that penetrates the ruptured dielectric. The resulting programmed antifuse may have a stable resistance of less than 250 ohms. The relatively high soaking current, however, requires a circuit with correspondingly large MOS transistors.

Rung has disclosed a circuit to program fuses with an SCR at U.S. Pat. No. 4,605,872 and incorporated herein by reference in its entirety. The circuit disclosed by Rung at FIGS. 1-3, however, provides a relatively high holding voltage due to the spacing between critical regions of the SCR. Furthermore, the circuit of Rung would require a separate fuse latch and is not well suited to parallel programming. These and other problems are resolved by the following embodiments of the present invention as will become apparent in the following discussion.

BRIEF SUMMARY OF THE INVENTION

In a preferred embodiment of the present invention, a circuit for programming a fuse is disclosed. The circuit includes a voltage supply terminal and a latch circuit. The latch circuit includes at least one p-channel transistor and at least one n-channel transistor. A semiconductor controlled rectifier is formed with the latch circuit and includes at least one terminal of the p-channel transistor. The fuse is coupled between the voltage supply terminal and the semiconductor controlled rectifier and is programmed in response to the semiconductor controlled rectifier.

BRIEF DESCRIPTION OF THE SEVERAL VIEWS OF THE DRAWING

FIG. 4 is a cross-sectional diagram of the layout of FIG. 3 along A-A';

FIG. 5 is a boost circuit that may be used to produce a fuse programming voltage for the fuse programming circuit of FIG. 2-3 or 9;

FIG. 6 is a timing diagram showing operation of the boost circuit of FIG. 5;

FIG. 9 is a schematic diagram of another embodiment of a fuse programming circuit having a triple well or isolated p-well process.

DETAILED DESCRIPTION OF THE INVENTION

The preferred embodiments of the present invention provide significant advantages in programming integrated circuit fuses operating at low supply voltages as will become evident from the following detailed description.

Figure 2:
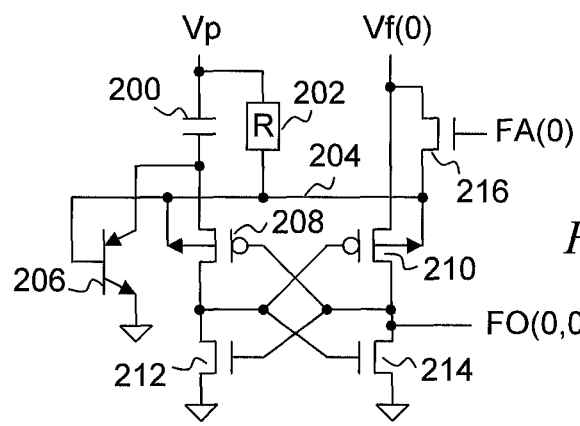
FIG. 2 is a schematic diagram of a fuse programming circuit of the present invention.
Figure 3:
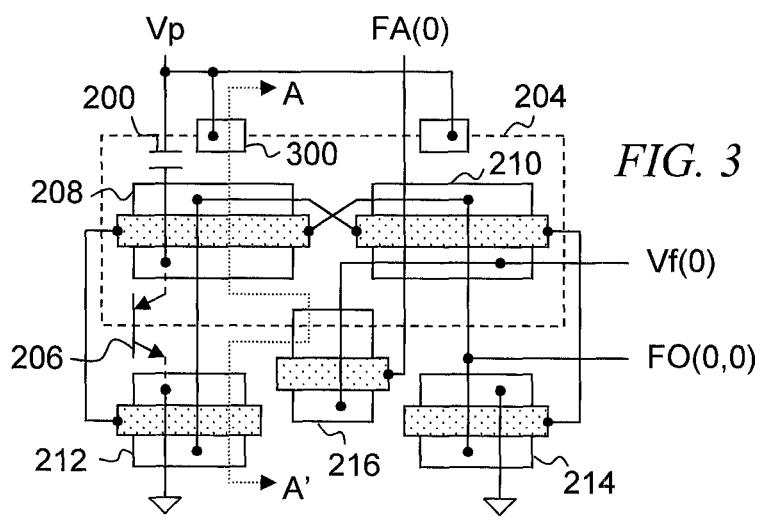
FIG. 3 is a simplified layout diagram of the fuse programming circuit of FIG. 2.

Referring to FIG. 2, there is a one bit fuse programming circuit of the present invention. Although the fuse programming circuit is specifically directed to antifuse programming, one of ordinary skill in the art having access to the instant specification will understand the present invention is also applicable to other fuses. The circuit includes antifuse 200, SCR 206, fuse latch circuit 208-214, and a trigger transistor 216. Fuse latch circuit 208-214 includes p-channel transistors 208-210 and n-channel transistors 212-214. FIG. 3 is a simplified layout of the circuit of FIG. 2. Control gates of the transistors are indicated by dotted infill. FIG. 4 is a cross-sectional diagram of the layout of FIG. 3 along A-A'. Here and in the following discussion the same reference numerals are used to indicate the same elements.

Prior to programming, antifuse 200 is electrically an open circuit having a resistance on the order of 1e9 ohms or more. In this state, programming voltage Vp and fuse voltage Vf(0) are equal to supply voltage Vdd. Fuse address signal FA(0) is low so that n-channel transistor 216 is off. Parasitic resistor 202 holds the bulk terminal of p-channel transistors 208-210 at programming voltage Vp. The fuse latch 208-214 is set so that p-channel transistor 210 and n-channel transistor 212 are both on. Correspondingly, p-channel transistor 208 and n-channel transistor 214 are both off. Thus, fuse output signal FO(0,0) is high, indicating antifuse 200 has not been programmed.

Figure 1A:
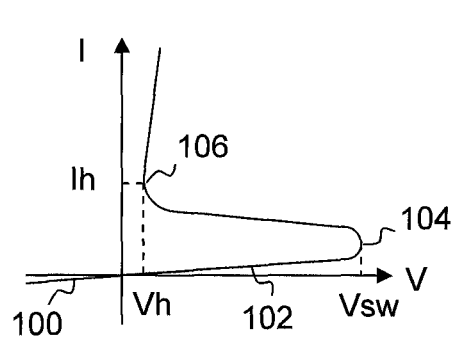
FIG. 1A is a current-voltage diagram of a semiconductor controlled rectifier of the prior art.
Figure 1B:
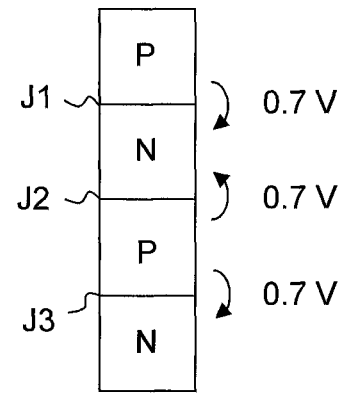
FIG. 1B is a simplified diagram of a semiconductor controlled rectifier of the prior art.

Referring now to FIGS. 3-4, the structure of SCR 206 will be explained in detail. SCR 206 is incorporated in the design of fuse latch circuit 208-214 so that no additional layout area is required. The plus sign (+) in the following discussion indicates a heavily doped semiconductor region having a concentration of at least 1e18 Atoms/cm^3. Alternatively, the minus sign (−) indicates a lightly doped semiconductor region having a concentration of less than 1e18 Atoms/cm^3. SCR 206 includes both PNP and NPN bipolar transistors as shown at FIG. 1B. The P+ source of p-channel transistor 208 is the anode of SCR 206 and together with n-well 204 and P− substrate 400 they form the emitter, base, and collector, respectively, of the PNP bipolar transistor. The n-well 204, P− substrate 400, and source of n-channel transistor 212 form the collector, base, and emitter, respectively, of the NPN bipolar transistor. Terminal 404 of n-channel trigger transistor 216 is electrically connected to n-well 204. There are several features of the circuit of FIGS. 2-4 that provide significant advantages over fuse programming circuits of the prior art. First, the SCR 206 is incorporated in the fuse latch circuit 208-214 so that no additional layout area is required. Second, the sources of p-channel transistor 208 and n-channel transistor 212 are closely spaced without other intervening heavily doped semiconductor regions to provide a minimum holding voltage when SCR 206 is latched. This is important for low voltage operation. Third, the width direction of p-channel transistor 208 and n-channel transistor 212 are parallel and closely spaced to provide maximum width with minimum power dissipation and heat generation in a latched state. Fourth, the transistors of the fuse latch circuit are shown with a width-to-length (W/L) ratio of greater than one so that intervening buffer stages for fuse output signal FO(0,0) may not be required. However, with a width of less than 1 µm, SCR 206 will sink a soaking current of 30 mA for typical complementary metal oxide semiconductor (CMOS) processes. Fifth, n-well contacts such as n-well contact 300 are advantageously positioned adjacent the drain side of p-channel transistors 208-210 and opposite their sources. As illustrated in FIG. 4, this increases the n-well resistance of parasitic resistor 202 by increasing the distance to the N+/P− junction J2 as well as reducing the n-well cross-sectional area for conduction due to the depletion width of P+/N− depletion region. Finally, the increased value of resistor 202 decreases the shunt resistance across the base-emitter junction of the PNP bipolar transistor and reduces trigger current required by n-channel trigger transistor 216. Thus, only a minimum size n-channel trigger transistor 216 is necessary and the holding voltage of SCR 206 is further reduced.

Figure 7:
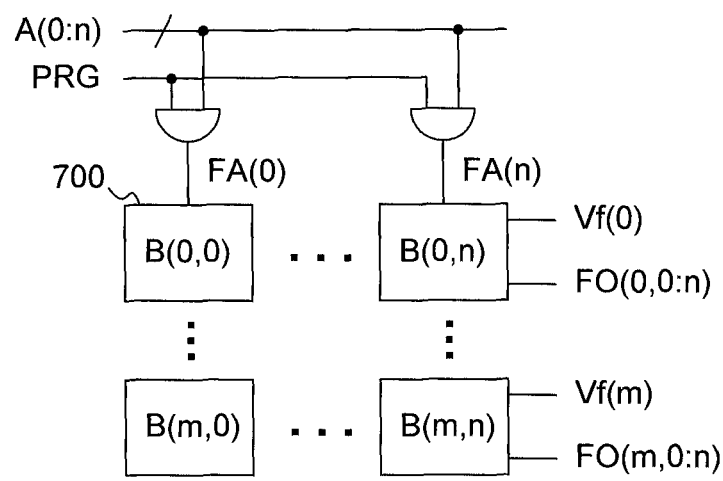
FIG. 7 is a schematic diagram of an array of fuse programming circuits as in FIG. 2-3 or 9.

Referring now to FIG. 7, there is a schematic diagram of an array of fuse programming circuits as in FIGS. 2-4. Each fuse programming circuit, such as fuse programming circuit 700, is the same as described at FIGS. 2-4. The array of fuses is organized in rows and columns. In the example of FIG. 7, there are m+1 rows and n+1 columns, where m and n are both positive integers. Each row of fuse programming circuits may correspond to a redundant row decoder, a redundant column decoder, or other desired circuit operations to be modified by fuse programming. Each row of fuse programming circuits produces n+1 fuse output signals. For example, the first row produces fuse output signals FO(0,0:n).

Figure 8:
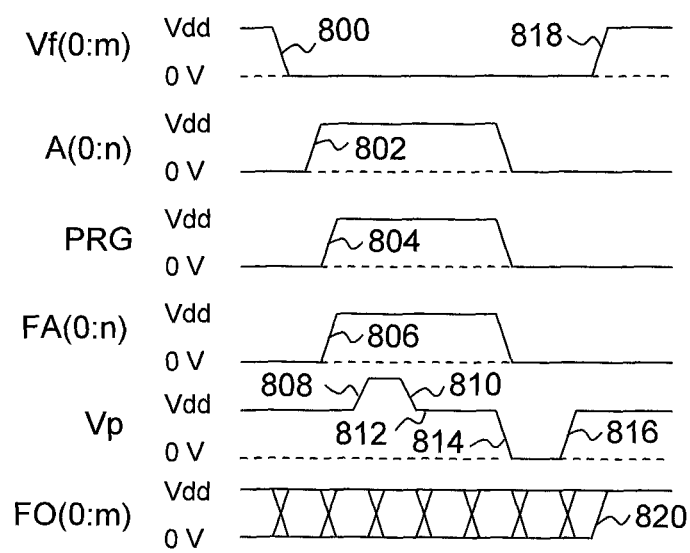
FIG. 8 is a timing diagram showing operation of the array of fuse programming circuits of FIG. 7.

The timing diagram of FIG. 8 will be used to explain operation of the array of fuse programming circuits of FIG. 7. Initially the programming voltage Vp and the fuse voltage Vf(0:m) are both at power supply voltage Vdd. By way of example, the following explanation will apply specifically to fuse programming circuit 700, although the entire row B(0,0) through B(0,n) might be programmed at one time. At time 800, fuse voltage Vf(0:m) goes low. This grounds the source of p-channel transistor 210 and the source of n-channel transistor 216 (FIG. 2). At time 802, a program address is applied to address bus A(0:n). If the fuse 200 of fuse programming circuit 700 is to be programmed, address A(0:0) will be high. The address for any fuse programming circuit in row 0 that is not to be programmed will remain low. At time 804, programming signal PRG goes high and applies a high level fuse address FA(0:0) at time 806 to fuse programming circuit 700. The high level of FA(0:0) turns on n-channel trigger transistor 216 and pulls n-well 204 low to provide base current to the PNP transistor of SCR 206. Responsively, SCR 206 latches and drives the anode of SCR 206 to holding voltage 106 (FIG. 1A). Programming voltage Vp is then boosted at time 808 to a high level above power supply voltage Vdd. This boosted level exceeds the dielectric rupture voltage and shorts fuse 200. Programming voltage Vp subsequently returns to power supply voltage Vdd at time 810. At time 812, SCR 206 remains latched and sinks the soaking current through fuse 200 to alloy the shorted terminals and provide a low resistance conductive path. After fuse 200 is permanently alloyed to produce a low resistance path, programming voltage Vp goes low at time 814 to turn off or unlatch SCR 206. At approximately the same time, address A(0:0) and programming signal PRG go low. Responsively, fuse address FA(0:0) goes low and turns off n-channel trigger transistor 216. At time 816 programming voltage Vp returns high to prepare to set the latch of fuse programming circuit 700. At time 818, fuse voltage Vf(0:0) returns high to set the fuse latch 208-214. This produces a valid fuse output signal FO(0:0) at time 820.

There are several advantages to this programming method. First, it is possible to program single or multiple fuse programming circuits on row 0 by selectively applying a high level signal on address bus A(0:n). This is easily accomplished in a design-for-test (DFT) mode as is well known to those of ordinary skill in the art. Second, each row 0-m may be individually programmed as necessary without affecting previously programmed rows. Moreover, multiple fuse arrays as in FIG. 7 may be separately programmed without affecting previously programmed fuse arrays. Third, raising programming voltage Vp at time 816 while fuse voltage Vf(0:0) remains low produces a high level signal at the control gates of p-channel transistor 210 and n-channel transistor 214 over a wide range of programmed resistance values for fuse 200. This is because fuse output signal FO(0:0) remains low and p-channel transistor 208 remains on. However, when fuse 200 is not programmed or open, subthreshold leakage of n-channel transistor 212 will hold the control gates of p-channel transistor 210 and n-channel transistor 214 low. The fuse latch circuit 208-214, therefore, is correctly set for a wide range of programmed resistance values of fuse 200. Fourth, all transistors of the fuse programming circuit of FIG. 3 may be near minimum design size. Thus, required layout is greatly reduced over methods of the prior art. Additionally, SCR 206 is integrated into fuse latch 208-214 to further reduce required layout area. It is desirable, however, to assure that current density through the metal-to-silicon contacts of SCR 206 remains below 1e7 A/cm^2. Finally, the low holding voltage of SCR 206 greatly reduces power dissipation and heat generation during programming as compared to other methods of the prior art. Thus, reliability is greatly improved.

Referring now to FIG. 5, there is a boost circuit that may be used to generate power supply voltage Vp. This circuit provides a significant advantage in fuse programming when an external terminal for Vp is not available. This condition may occur in a packaged integrated circuit where an external terminal would require an additional package connector. Moreover, internal regulated voltage supplies of the integrated circuit may be insufficient to program a fuse. The boost circuit includes p-channel transistor 502 having a source and terminal connected to power supply terminal Vdd and having drain and bulk terminals connected to programming voltage supply terminal Vp. N-channel transistor 508 has a current path coupled between the drain of p-channel transistor 502 and the drain of n-channel transistor 510. The control gate of n-channel transistor 508 is connected to power supply terminal Vdd to reduce the maximum gate-to-drain voltage across n-channel transistor 510 during fuse programming. The control gate of p-channel transistor 502 is connected to the output terminal of OR gate 500. Low voltage programming signal/Vp1 is applied to one input of OR gate 500 as well as to the control gate of n-channel transistor 510. The other input terminal of OR gate 500 is coupled to receive boost signal P*. Boost signal P* is also applied to delay circuit 504. The output terminal of delay circuit 504 is coupled to programming voltage supply terminal Vp via boost capacitor 506.

Turning now to the timing diagram of FIG. 6, operation of the boost circuit of FIG. 5 will be explained in detail. Low voltage programming signal/Vp1 and boost signal P* are initially low. Thus, the output of OR gate 500 is low and p-channel transistor 502 is on. Programming supply voltage Vp is initially equal to power supply voltage Vdd. Boost capacitor 506, therefore, is charged to power supply voltage Vdd. Boost signal P* is briefly pulsed 602 to power supply voltage Vdd level. The high level of boost signal P* turns off p-channel transistor 502 via OR gate 500. Delay stage 504 briefly delays the high level of boost signal P* until p-channel transistor 502 is off then produces a boosted level 600 of programming supply voltage Vp via boost capacitor 506. The bulk terminal of p-channel transistor 502 is connected to programming supply voltage terminal Vp to prevent turning on the parasitic PNP transistor of p-channel transistor 502. Programming voltage Vp returns to the power supply voltage Vdd level when boost signal P* returns low. Programming voltage Vp remains at the Vdd level for time 604 to provide soaking current through fuse 200 as previously explained with regard to FIG. 8. This soaking current serves to alloy the shorted terminals and provide a low resistance conductive path. After fuse 200 is permanently alloyed to produce a low resistance path, programming voltage Vp goes low 608 to turn off or unlatch SCR 206 (FIG. 2). At time 610, programming voltage Vp returns to the Vdd level, corresponding to time 816 of FIG. 8. The boost circuit of FIG. 5 advantageously produces a sufficiently high and controlled voltage to program fuses when an external voltage is not available. Programming voltage and current is determined by the size of boost capacitor 506. No thin oxide transistors in the selected or unselected switching circuits receive a voltage across gate oxide that is greater than supply voltage Vdd.

Embodiments of the previous discussion illustrate activation of SCR 206 (FIG. 2) by injecting PNP base current via n-channel trigger transistor 216. With a slight modification, however, SCR 206 may alternatively be activated by injecting NPN base current. This is advantageous for triple well processes where a p-well may be isolated or floating within an n-well. Such a circuit is illustrated at FIG. 9. Here, however, fuse voltage Vf(0) and fuse address signal FA(0) remain high when fuse 200 is to be programmed. All other fuse address signals for fuses that are not to be programmed remain low. Likewise, the fuse voltage Vf(1:m) for rows that are not being programmed also remains low. The high level of FA(0) turns on n-channel transistor 716 to provide base current to the NPN transistor of SCR 206 at terminal 910, which is also the common bulk terminal of n-channel transistors 912 and 914.

Other operations of the fuse programming circuit of FIG. 9 proceed in a similar manner to those previously described with regard to FIG. 2.

Still further, while numerous examples have thus been provided, one skilled in the art should recognize that various modifications, substitutions, or alterations may be made to the described embodiments while still falling with the inventive scope as defined by the following claims. Other combinations will be readily apparent to one of ordinary skill in the art having access to the instant specification.

What is claimed is:

1. A circuit, comprising:
   a voltage supply terminal;
   a latch circuit comprising a p-channel transistor and an n-channel transistor;
   a semiconductor controlled rectifier comprising a source of the p-channel transistor and a source of the n-channel transistor; and
   a fuse coupled between the voltage supply terminal and the semiconductor controlled rectifier, wherein the fuse is programmed in response to the semiconductor controlled rectifier.

2. A circuit as in claim 1, wherein the source of the p-channel transistor and the source of the n-channel transistor are closely spaced without intervening heavily doped semiconductor regions.

3. A circuit as in claim 1, wherein a width direction of the p-channel transistor is parallel to a width direction of the n-channel transistor.

4. A circuit as in claim 1, wherein the semiconductor controlled rectifier has a current path in parallel with a current path of the p-channel transistor.

5. A circuit as in claim 1, wherein the semiconductor controlled rectifier has a current path in parallel with a current path of the n-channel transistor.

6. A circuit as in claim 1, wherein the fuse is an antifuse.

7. A circuit as in claim 1, comprising a trigger transistor having a control terminal coupled to receive a control signal, wherein the trigger transistor provides base current to a PNP transistor of the semiconductor controlled rectifier in response to the control signal.

8. A circuit as in claim 1, comprising a trigger transistor having a control terminal coupled to receive a control signal, wherein the trigger transistor provides base current to an NPN transistor of the semiconductor controlled rectifier in response to the control signal.

9. A circuit as in claim 1, wherein the voltage supply terminal is formed on an integrated circuit, and wherein the voltage supply terminal is arranged to receive a supply voltage external to the integrated circuit.

10. A circuit as in claim 1, wherein the voltage supply terminal is formed on an integrated circuit, and wherein the voltage supply terminal is arranged to receive a boosted supply voltage produced by the integrated circuit.

11. An array of fuse programming circuits coupled to a voltage supply terminal, each fuse programming circuit comprising:
    a latch circuit comprising a p-channel transistor and an n-channel transistor;
    a semiconductor controlled rectifier comprising a source of the p-channel transistor and a source of the n-channel transistor; and
    a fuse coupled between the voltage supply terminal and the semiconductor controlled rectifier, wherein the fuse is programmed in response to the semiconductor controlled rectifier.

12. A circuit as in claim 11, wherein the source of the p-channel transistor and the source of the n-channel transistor are closely spaced without intervening heavily doped semiconductor regions.

13. A circuit as in claim 11, wherein the array comprises:
   a plurality of rows of fuse programming circuits, each row coupled to receive a respective first signal;
   a plurality of columns of fuse programming circuits, each column coupled to receive a respective second signal; and
   a plurality of signal leads arranged to produce an output signal indicating a state of each fuse programming circuit of the array.

14. A circuit as in claim 11, wherein the semiconductor controlled rectifier has a current path in parallel with a current path of the p-channel transistor.

15. A circuit as in claim 11, wherein the semiconductor controlled rectifier has a current path in parallel with the current path of the n-channel transistor.

16. A circuit as in claim 11, wherein the fuse is an antifuse.

17. A circuit as in claim 11, comprising a trigger transistor having a control terminal coupled to receive a control signal, wherein the trigger transistor activates the semiconductor controlled rectifier in response to the control signal.

18. A fuse latch circuit, comprising:
   a p-channel transistor;
   an n-channel transistor;
   a semiconductor controlled rectifier comprising a source of the p-channel transistor and a source of the n-channel transistor, wherein the source of the p-channel transistor and the source of the n-channel transistor are closely spaced without intervening heavily doped semiconductor regions; and
   a fuse coupled between a voltage supply terminal and the semiconductor controlled rectifier, wherein the fuse is programmed in response to the semiconductor controlled rectifier.

19. A fuse latch circuit as in claim 18, wherein a current path of the p-channel transistor is in series with a current path of the n-channel transistor, and wherein a current path of the semiconductor controlled rectifier is in parallel with the current paths of the p-channel and n-channel transistors.

20. A fuse latch circuit as in claim 18, wherein the fuse is an antifuse.

* * * * *